United States Patent [19]

Tsai

[11] Patent Number: 4,719,497
[45] Date of Patent: Jan. 12, 1988

[54] HIGH EFFICIENCY LIGHT-EMITTING DIODE

[75] Inventor: Ming-Jong Tsai, San Jose, Calif.

[73] Assignee: Hewlett-Packard Company, Palo Alto, Calif.

[21] Appl. No.: 868,161

[22] Filed: May 27, 1986

Related U.S. Application Data

[63] Continuation of Ser. No. 620,978, Jun. 15, 1984, abandoned.

[51] Int. Cl.⁴ .......................... H01L 33/00; H01S 3/19
[52] U.S. Cl. ........................................ 357/17; 357/16; 372/45; 372/46
[58] Field of Search ............... 357/17, 16, 20; 372/45, 372/46, 44

[56] References Cited

U.S. PATENT DOCUMENTS

| | | | |
|---|---|---|---|
| 4,011,113 | 3/1977 | Thompson et al. | 357/17 |
| 4,213,808 | 7/1980 | Thompson et al. | 372/46 |
| 4,280,858 | 7/1981 | Van Opdorp et al. | 357/16 |
| 4,517,674 | 5/1985 | Liu et al. | 357/17 |

Primary Examiner—William L. Sikes
Assistant Examiner—Georgia Y. Epps
Attorney, Agent, or Firm—Edward Y. Wong

[57] ABSTRACT

A structure and method for use in optical communication systems is provided in which a metal is diffused in a heterojunction region beneath a metal contact of a AlGaAs light emitting diode. This structure and method significantly reduces the contact shadowing problem due to current crowding beneath the contact thus increasing the light output from the device.

12 Claims, 2 Drawing Figures

HIGH EFFICIENCY LIGHT-EMITTING DIODE

This application is a continuation of Ser. No. 620,978 filed June 15, 1984, now abandoned.

BACKGROUND

This invention relates to a method of and a structure for improving light efficiency through a double heterojunction in AlGaAs red light emitting diodes (LED's) by reducing contact shadowing due to current crowding beneath the contact area. These AlGaAs LED's are for use in, for example, optical fiber communication systems.

Presently, AlGaAs light emitting diodes which are characterized by a double heterojunction have low luminous efficiencies because of contact shadowing due to current crowding at the p-n junction of the diode under the contact area. As external contact is made to the structure through a metal contact attached to the heterojunction region, light is emitted along the p-active layer as holes from the p-active layer (p-region) and electrons injected from the n-region of the p-n junction recombine to produce photons. However, the light emitted along the p-n junction under the contact is absorbed by the contact, which in effect acts as a shadow to a portion of the light being emitted from the entire p-n junction, thus reducing the total external light output. Therefore, in order to increase the output of the light being emitted along the entire p-n junction of the diode it is essential to minimize contact shadowing beneath the contact area.

SUMMARY OF THE INVENTION

In accordance with the illustrated preferred embodiment, the present invention diffuses a metal in a heterojunction region beneath a metal contact of an AlGaAs light emitting diode. Specifically, the invention takes a double heterojunction light emitting diode, which can be fabricated by any conventional processing method, and subjects it to a diffusion of zinc metal in the selected region. In the preferred embodiment, a contact made of metal, e.g., aluminum, is subsequently attached to the diode. The diffused zinc penetrates through the p-active layer of a first heterojunction region and extends into a portion of an n-region of a second heterojunction region. The zinc impurities in this portion of the n-region converts it to p-type and creates a p-n junction with a higher threshold voltage in this diffused region than those in the grown-in, nondiffused region. As current is applied to the diode via an external contact, the diffused region impedes the flow of current, consequently, the junction current beneath the contact region is shifted to outside the diffused region. The light emitting area is now concentrated at the periphery of the diffused region. Light output is then increased, because the light is no longer absorbed by the contact as before. This process, in short, reduces the contact shadowing problem due to current crowding beneath the contact of the prior art to increase the light output of a device by a factor of 2 to 5.

DETAILED DESCRIPTION OF THE INVENTION

Figure 1:
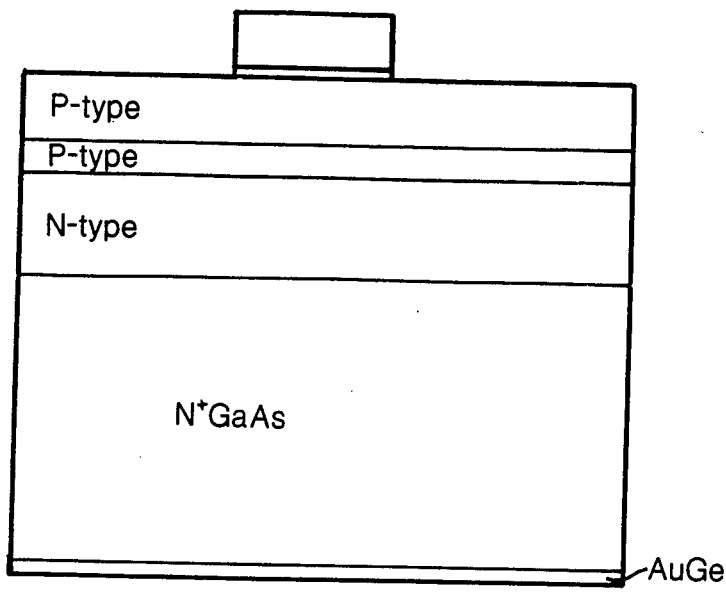
FIG. 1 shows a cross-sectional view of a double heterojunction AlGaAs light emitting diode in accordance with the prior art.
Figure 2:
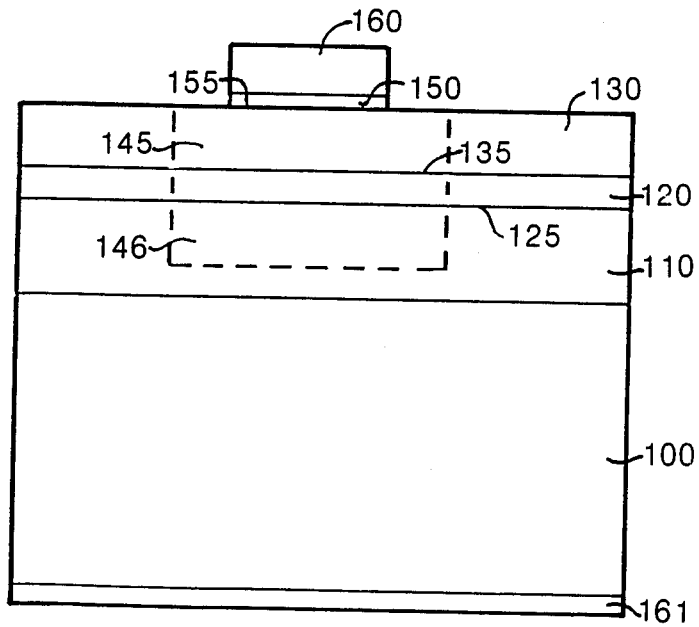
FIG. 2 shows a cross-sectional view of a double heterojunction AlGaAs light emitting diode in accordance with the present invention.

As illustrated in FIG. 2, an n-type aluminum gallium arsenide (AlGaAs) layer 110 having a thickness typically in the range of 5 to 20 microns is formed on an n-type AlGaAs substrate 100 by conventional techniques, such as by expitaxial growth. A p-active layer 120 is formed over the n-type AlGaAs layer 100, also by epitaxial growth methods. The p-active layer 120 is typically made of p-type AlGaAs having a thickness typically in the range of 0.5 to 2 microns. A first heterojunction 125 is thereby formed by the n-type AlGaAs layer 110 and the p-active layer 120.

A p-type AlGaAs layer 130 having a thickness typically in the range of 1 to 10 microns is formed over the p-active layer 120 by conventional techniques, such as by epitaxial growth. A second heterojunction 135 is thereby formed by the p-active layer 120 and the p-type AlGaAs layer 130.

A metal, for example, zinc, is diffused in a region 145 which incorporates the heterojunctions 125 and 135. The diffused zinc extends into and terminates at a portion 146 of the n-type AlGaAs layer 110 beneath the first heterojunction 125. Other materials such as cadmium can also be used for the diffusion metal. In the present invention, the zinc impurities in the diffused region 145 act as acceptors of electrons and counter-dopes the portion 146 of the n-type AlGaAs layer 110 beneath the first heterojunction 125 to make it p-type. The diffused region 145, which is not totally p-type, in effect redirects the current flowing through the device by impeding the flow of current through the diffused region. The junction current is redirected from beneath the contact to outside the diffused region.

A pre-contact layer 150, typically made of GaAs, is formed over a contact region 155 in the diffused region 145. A contact 160 is then formed over the pre-contact 150 in the contact region 155 by conventional techniques, such as evaporation or sputtering. The contact 160 is typically made of aluminum. A contact layer 161 is then formed over the remaining surface of the GaAs 100 by conventional methods. The contact layer 161 is typically made of gold-germanium alloy. As current is applied via contacts 160 and 161, the p-n junction regions outside the diffused region turn on before those in the diffused region because of the higher threshold voltage to the p-n junctions in the diffused region; this redirects the flow of current under the contact where the diffused region is, thereby reducing the contact shadowing due to current crowding and increasing light output at the periphery of the diffused region.

An increase in the measurable light output generated from the first heterojunction 125 (illustrated in FIG. 2) at the periphery of the diffused region is realized with the illustrated embodiment; light output on the order of 2.6 lumens/ampere at 2 milliamps of current without device encapsulation is common.

I claim:

1. A device for emitting light of a predetermined frequency range, said device comprising:
   a semiconductor base layer of a predetermined conductivity type and band gap;
   a semiconductor active layer forming a first heterojunction with said base layer, said active layer having a conductivity type opposite to that of said base layer and having a band gap narrower than that of said base layer;

a semiconductor window layer forming a second heterojunction with said active layer, said window layer having a band gap wider than that of said active layer;

current means for supplying a current through said layers so that light can be generated in at least a portion of said active layer, said current means being electrically coupled to said window layer and said base layer; and a dopant region extending generally orthogonally through said window and active layers and at least partially through said base layer, said dopant region being of conductivity type opposite that of said base layer so that a p-n junction is defined within said base layer, said p-n junction including the boundary of said region located within said base layer and including the portion of said first heterojunction outside said region so that when light is generated in said active layer at most a negligible amount of light is generated within said dopant region.

2. The device of claim 1 wherein said region is defined by a diffusion metal.

3. The device of claim 2 wherein said metal is zinc.

4. The device of claim 1 further comprising a metal contact disposed adjacent to the common volume of said window layer and said dopant region.

5. The device of claim 1 further comprising light-absorbing means disposed adjacent to the common volume of said window layer and said dopant region.

6. The device of claim 5 wherein the orthogonal projection of said light-absorbing means onto said first heterojunction is within said dopant region.

7. The device of claim 5 wherein said light-absorbing means includes a metal contact.

8. The device of claim 1 further comprising a substrate supporting said base layer and disposed on a side of said base layer opposite said heterojunction between said base layer and said active layer.

9. The device of claim 8 wherein the conductivity type of said window layer is positive.

10. The device of claim 8 wherein the conductivity type of said window layer is the same as said base layer.

11. The device of claim 4 further comprising a pre-contact layer between said contact layer and said window layer.

12. In a semiconductor device for emitting light of a predetermined frequency range, a structure comprising:

a semiconductor base layer of a predetermined conductivity type and band gap;

a semiconductor active layer forming a first heterojunction with said base layer, said active layer having a conductivity type opposite to that of said base layer and having a band gap narrower than that of said base layer;

a semiconductor window layer forming a second heterojunction with said active layer, said window layer having a band gap wider than that of said active layer, said, said window layer having a conductivity type opposite to that of said active layer;

current means for supplying a current through said layers so that light can be generated in at least a portion of said active layer, said current means including a contact electrically coupled to said window layer, said current means being electrically coupled to said base layer; and a dopant region extending generally orthogonally through said window and active layers and at least partially through said base layer, said dopant region intersecting the orthogonal projection of said contact onto the junction between said base layer and said active layer, said dopant region being of conductivity type opposite that of said base layer so that a p-n junction is defined within said base layer, said p-n junction including the boundary of said region located within said base layer and including the portion of said first heterojunction outside said region so that when light is generated in said active layer at most a negligible amount of light is generated within said dopant region.

* * * * *